United States Patent [19]

Kondo

[11] 4,170,156
[45] Oct. 9, 1979

[54] LEAD WIRE CUTTER

[76] Inventor: Kenshi Kondo, 3-5, Ohkura 1-chome, Setagaya-ku, Tokyo, Japan

[21] Appl. No.: 808,478

[22] Filed: Jun. 21, 1977

[30] Foreign Application Priority Data

Jun. 21, 1976 [JP] Japan .................. 51-80367[U]
Jun. 25, 1976 [JP] Japan .................. 51-82779[U]
Jul. 8, 1976 [JP] Japan .................. 51-80364
Feb. 9, 1977 [JP] Japan .................. 52-13598[U]
Feb. 9, 1977 [JP] Japan .................. 52-13599[U]

[51] Int. Cl.² .................. B26D 1/28; B26D 7/24; B23C 1/08; B23C 5/26
[52] U.S. Cl. .................. 83/418; 83/435.2; 83/437; 83/666; 83/925 A; 83/DIG. 1; 83/404; 409/229
[58] Field of Search ............ 83/418, 404, 580, 925 A, 83/DIG. 1, 666, 435.2, 437; 318/212; 90/18, 19, 20

[56] References Cited

U.S. PATENT DOCUMENTS

| | | | |
|---|---|---|---|
| 764,399 | 7/1904 | Villiger | 83/666 |
| 2,493,670 | 1/1950 | Harvey et al. | 318/212 X |
| 2,929,977 | 3/1960 | Choudhury | 318/212 |
| 3,656,393 | 4/1972 | Goellner | 83/666 |
| 3,949,661 | 4/1976 | Greider | 83/DIG. 1 |
| 3,972,262 | 8/1976 | Albert | 83/404 |

*Primary Examiner*—Donald R. Schran
*Attorney, Agent, or Firm*—Staas & Halsey

[57] ABSTRACT

A lead wire cutter which comprises an automatic conveyor mechanism for print circuit boards which conveys said print circuit boards one by one from one end to the other and a cutter mechanism placed in the path of conveying said print circuit boards and provided with a rotatable blade which faces lead wires of parts soldered to and extending beyond said print circuit boards. This lead wire cutter is used for quickly and automatically removing lead wires in the portion extending beyond the opposite side of print circuit boards.

3 Claims, 15 Drawing Figures

LEAD WIRE CUTTER

BACKGROUND OF THE INVENTION

The present invention relates to a lead wire cutter which cuts off lead wires of electric parts soldered to print circuit boards with rotatable blade of the cutter mechanism while the print circuit boards are conveyed.

In general, lead wires of electric parts are soldered to given places of print circuit boards with recent development of wiring techniques. In the manufacture of print circuit boards, open ends of lead wires of electric parts soldered to given places of the boards penetrate therethrough and extend beyond the opposite side of the circuit boards. Lead wires in the portion extending beyond the circuit boards are undesirable because they often cause short circuit of electric current and the like troubles. Hitherto, lead wires extending beyond circuit boards were cut off manually by using such cutting tools as nippers or in a better manner by bringing lead wires in such extending portion into contact with a blade rotated at a high speed. According to such prior art methods, however, it is difficult to carry out the cutting operation continuously without any danger. In the above mentioned situation, there is a great demand for development of a lead wire cutter capable of quickly and automatically cutting lead wires in a continuous operation.

BRIEF SUMMARY OF THE INVENTION

It is an object of the present invention to provide a lead wire cutter capable of a continuous operation by the use of an automatic conveyor mechanism for conveying print circuit boards continuously and of a cutter mechanism for cutting lead wires with a rotating cutting blade.

It is another object of the present invention to provide a lead wire cutter wherein a cylinder and a piston are used as the automatic conveyor mechanism whereby the movement in one direction of the reciprocal piston movement is utilized for conveying the print circuit boards to provide a quiet operation.

It is still another object of the present invention to provide a lead wire cutter wherein a continuous conveying of print circuit boards is effected without utilizing any guide rails by using as the automatic conveyor mechanism a pair of endless chains which are parallel in portions where they face each other and wherein print circuit boards are held between holding pallets fixed to the endless chains.

It is further object of the present invention to provide a lead wire cutter improved in cutting ability, safety and durability wherein the rotatable blade of the cutter mechanism is fixed at a given pressure depending upon the speed of rotation.

It is still further object of the present invention to provide a lead wire cutter provided with a safety device for preventing unexpected accidents during the cutting operation.

Other objects, features and advantages of the present invention will become apparent more fully from the following description.

DETAILED DESCRIPTION OF THE INVENTION

The present invention can more fully be understood from the following description taken in conjunction with the accompanying drawings in which.

Figure 1B:
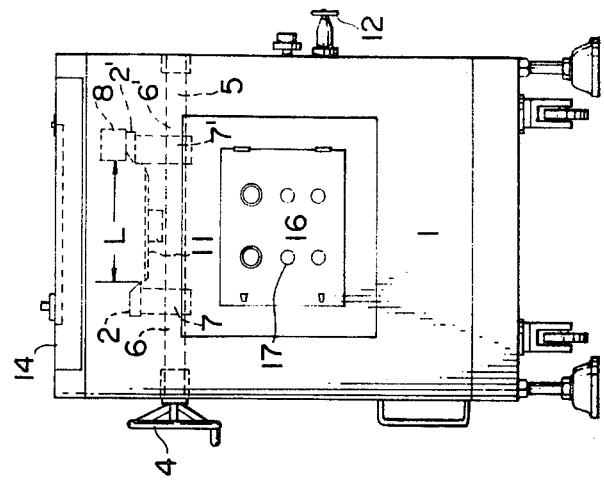
FIG. 1 is a schematic representation showing one example of the lead wire cutter of the present invention, with FIG. 1 A being a front view of the lead wire cutter and FIG. 1 B a side view of the lead wire cutter.
Figure 1A:
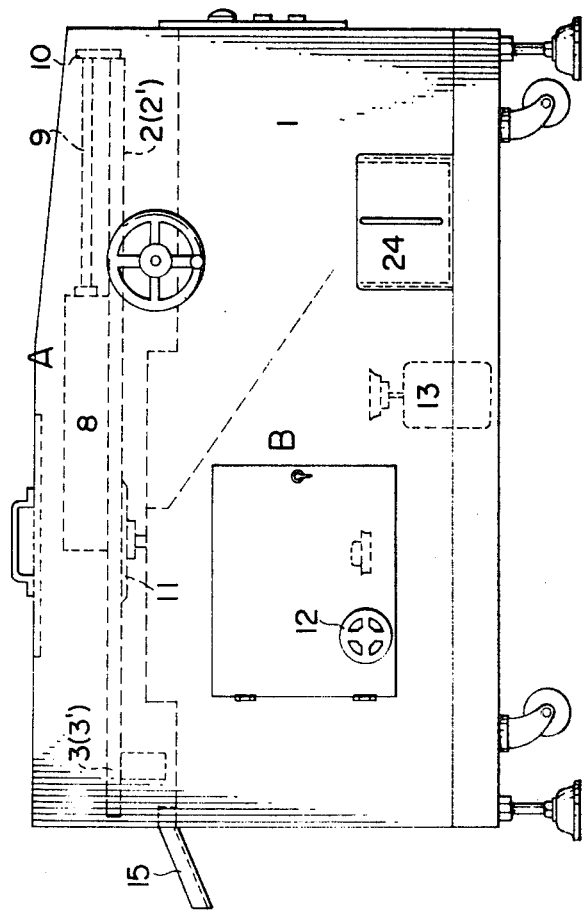

In FIGS. 1-A and 1-B showing respectively front and side views of one example of the lead wire cutter of this invention, the main body 1 is provided in the upper portion thereof with two parallel rails 2 and 2' facing each other at the same height. On the facing surfaces of the rails are provided furrows 3 and 3' rectangularly recessed in cross section, with which print circuit boards (PCB) are engaged slidably. A handle 4 is an adjuster for a distance between the rails 2 and 2'. By turning the handle 4, a lead screwbolt 5 is rotated. On the lead screwbolt are formed both left-handed and right-handed screws 6 and 6' with which a nut 7 supporting the rail 2 and a nut 7' supporting the rail 2' are screw-engaged, respectively. Thus, rotation of the lead screwbolt 5 motivated by handle 4 enables adjustment of the distance L between the rails 2 and 2'. An air or oil cylinder 8 is situated along the rail 2 or 2' and a piston 9 moves reciprocally by the action of compressed air or oil. To the tip of the piston 9 is mounted a pushing device 10 which conveys a print circuit board along the rails 2 and 2' by pushing the rear side of the print circuit board when the piston 9 moves in the direction of the solid arrow. Usually, one reciprocal movement of the piston enables conveying of one print circuit board along the rails. However, it is possible to carry more than one print circuit board by one reciprocal movement of the piston when the location of the cylinder or the length of the piston arm is suitably adjusted. The above mentioned operation is attained by the automatic conveyor mechanism A for print circuit boards.

In the main body 1 is also installed the cutter mechanism B having a rotatable blade 11 situated below the rails 2 and 2'. The rotatable blade 11 made, for example, of a super hard alloy may be moved up and down to adjust its height and position by turning a handle 12. On the top cover or the main body 1 is mounted an openable observation window 14 having a knob, which is constructed, as will be referred to in detail hereinafter, in such a manner that the rotating blade 11 may quickly be brought to a halt when the openable observation window 14 is opened while the cutter mechanism is in operation. On the side where print circuit boards to be treated are fed is mounted a control panel 16 having various control switches including an emergency stop switch 17. On the side opposite to the side where print circuit boards are fed is mounted a chute 15 through which print circuit boards having lead wires cleanly cut are dropped.

Figure 2:
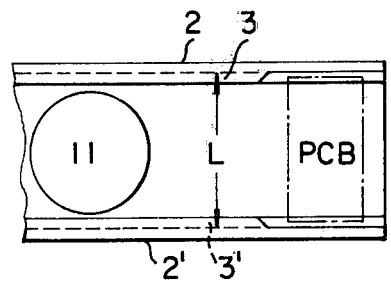
FIG. 2 is a plan view showing schematically the structure of the conveyor mechanism using guide rails.

In FIG. 2, the upper portions of the furrows 3 and 3' formed respectively on the opposite sides of the rails 2 and 2' are removed on the side where print circuit boards to be treated are fed. Thus, the print circuit boards to be treated can easily be placed on the rails from above and engaged with the furrows.

In an actual operation of the cutter mechanism B, the motor is driven and a print circuit board to be placed between the rails 2 and 2' as shown in FIG. 2. On the other hand, the piston 9 moves reciprocally normally at a given periodic cycle, thus making it possible to allow the print circuit board to advance by one stroke when the pushing device 10 is moved to advance and then recede by one cycle of the piston movement. The next print circuit board is pushed forward in a similar manner, pushing the initially supplied print circuit board in front of it. As the print circuit boards are conveyed in order along the rails 2 and 2' by the periodical action of the piston 9, lead wires penetrating through the boards and extending beyond the back side of the boards are brought into contact with the blade 11 situated in the path of the advancing print circuit boards at a predetermined height and rotated at a high speed whereby the lead wires extending beyond the boards are cut off cleanly or at a given length. The finished print circuit boards reach the other side of the cutter (left side in FIG. 1-A) and drop through the chute 15. The finished print circuit boards are recovered as such or successively or automatically supplied to further processing machines if necessary.

Figure 3B:
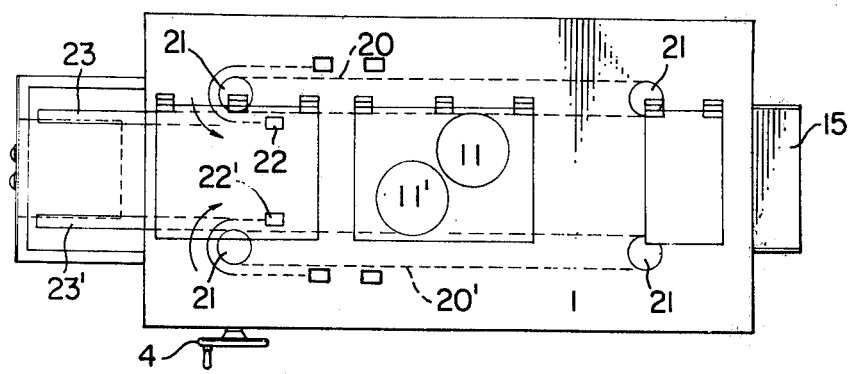
FIG. 3 is a schematic representation showing another example of the lead wire cutter of the present invention, with FIG. 3 A being a plane view of the cutter, FIG. 3 B a front view of the cutter and FIG. 3 C a side view of the cutter.
Figure 3A:
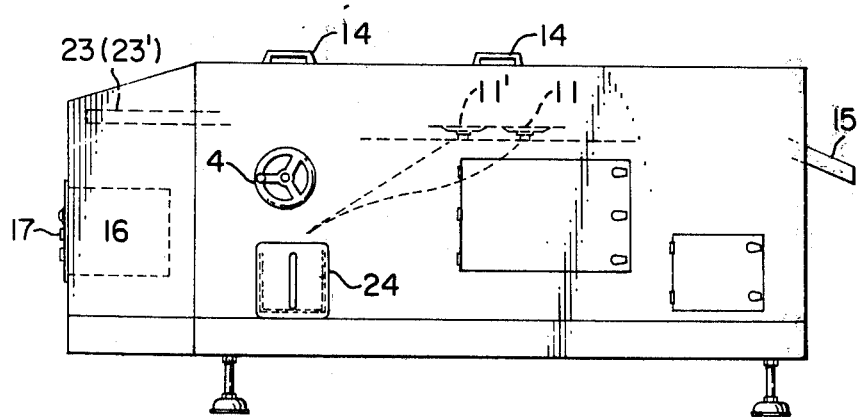
Figure 3C:
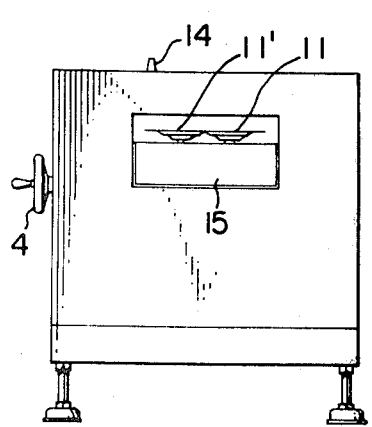

In FIGS. 3-A, 3-B and 3-C showing another example of the lead wire cutter of this invention, a difference from the one shown in FIG. 1 or 2 is found fundamentally in the point that the automatic conveyor mechanism A used in the cutter shown in FIG. 3 comprises a pair of parallel endless chains 20 and 20' in place of the guide rails. As a minor difference, the cutter mechanism of the cutter shown in FIG. 3-A comprises two rotatable blades 11 and 11'. The use of more than one rotatable blade is advantageous in such case wherein the width of print circuit boards is relatively large or entire cutting of lead wires is desired from end to end of the board. The mechanism for driving plural rotatable blades is quite identical with that for driving one rotatable blade. In the example of FIG. 3, a pair of the endless chains 20 and 20' are supported by plural sprockets 21 and are parallel at least in the portion where they face each other. On the facing side of each chain, a lot of holding pallets 22 or 22' are fixed at a definite pitch in such manner that any holding pallet on the chain 20 or 20' faces another corresponding one on the opposite chain. Guide rails 23 and 23' are used only for fitting point circuit boards to the endless chains on the side of feeding the boards.

In a practical operation of the cutter, print circuit boards to be treated are inserted between the furrows on the facing guide rails 23 and 23' and moved forward until they are held between the holding pallets 22 and 22' on the endless chain 20 and 20'. By the movement of the endless chains in a forward direction, lead wires of electric parts pentrating through the boards and extending beyond the opposite side of the boards are brought into contact with the rotatable blades 11 and 11' situated in the path of conveying the boards and rotated at a high speed whereby the extending lead wires are cut off in a similar manner as referred to in the case of the cutter shown in FIG. 1. When the holding pallets reach the other end, they release the finished print circuit board which is then pushed by the subsequent board and drops through a chute 15.

In FIGS. 3-A, 3-B and 3-C, the same indicative numerals as those given in FIGS. 1-A and 1-B are identical in the meanings. In the cutters shown in these FIGS. 1 and 3, a receptacle for the cut lead wires may be inserted into the main body 1 and occasionally taken out for disposal of the cut lead wires. In both FIGS. 1-A and 3-A, such receptacle is shown by the indicative numeral 24. In this connection, it is to be construed that in these cutters, the parts having no direct relation with the mechanisms indispensable for the present invention, for example, supporting legs of the main body, side access doors and the like parts only necessary for usual maintenance of the mechanical assemblies are not indicated by indicative numerals nor explained.

Figure 4:
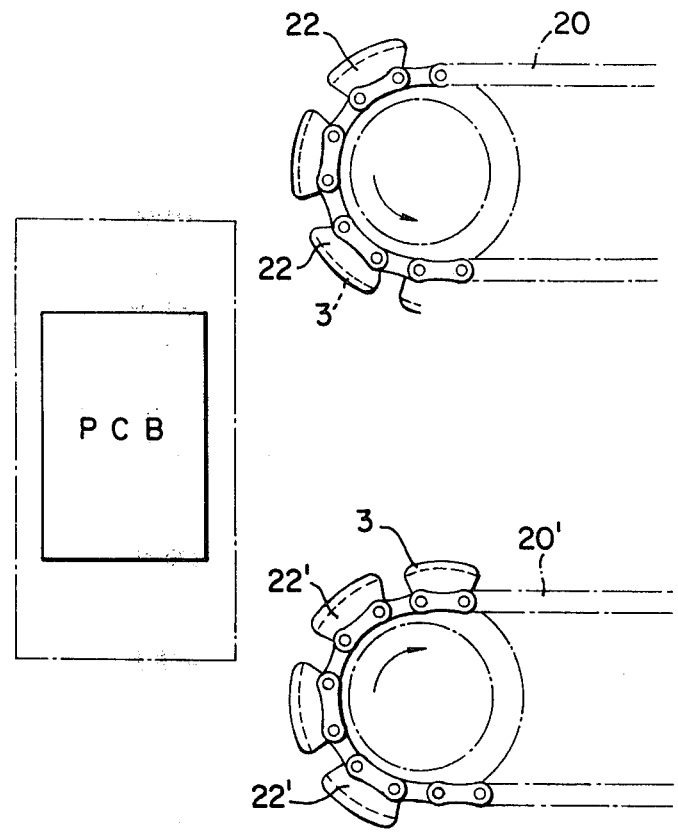
FIG. 4 is a plan view showing one example of the holding pallets fixed to a pair of endless chains.

In FIG. 4, a lot of holding pallets 22 and 22' are fixed at a definite pitch to a pair of endless chains 20 and 20' for conveying print circuit boards to be treated. The size of the holding pallets may be varied according to the size of print circuit boards to be treated.

Figure 5:
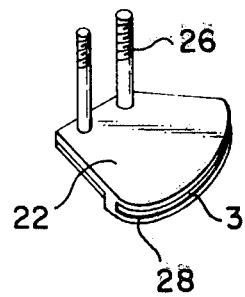
FIG. 5 is a perspective view showing the holding pallet of FIG. 4.

In FIG. 5, the holding pallet 22 has a furrow 3 into which the edge portion of the print circuit board is inserted, and a connecting member 26 for connecting the holding pallet to the endless chain.

Figure 6:
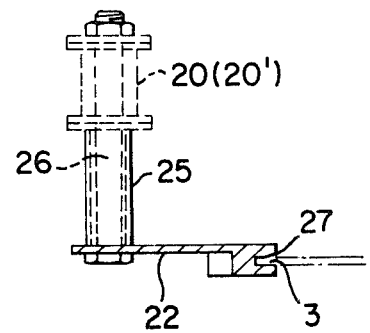
FIG. 6 is a cross sectional view of the holding pallet fixed to the endless chain.

In FIG. 6, the holding pallet 22 is connected in L-shape to the endless chain 20 through the connecting member 26 and a collar 25 surrounding it.

As shown in FIGS. 4 and 5, the front side of the holding pallet is curved to form an L-shape and thus has an arc-shaped furrow 3. The arc-shape of the furrow 3 facilitates attachment and detachment of print circuit boards, especially attachment thereof. As shown in FIG. 4, the arc-shaped furrow 3 of the holding pallet 22 or 22' draws, on moving along the semicircular orbit of the endless chain 20 or 20', a semicircular locus corresponding to that of the endless chain thereby ensuring smooth holding of print circuit boards between the facing holding pallets. Needless to say, the arc-shaped furrow 3 may be chamferred at its upper edge 27 and/or its side edge 28 thereby further facilitating attachment and detachment of print circuit boards.

The automatic conveyor mechanism shown in FIG. 4 is based on the relation between a conveyor driving system intrinsic to the automatic conveyor mechanism and a pair of conveyor assemblies provided with holding pallets arranged so as to face each other on the assemblies. The arc-shaped furrows of the holding pallets serve to give them good holding function on movement along the semicircular orbit of the endless chain thereby facilitating and ensuring attachment and detachment of print circuit boards.

Figure 7:
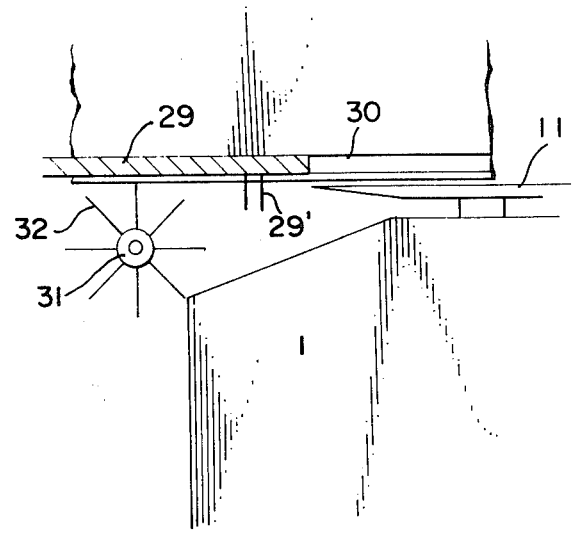
FIG. 7 is a side view schematically showing one example of the anti-warp mechanism.
Figure 8:
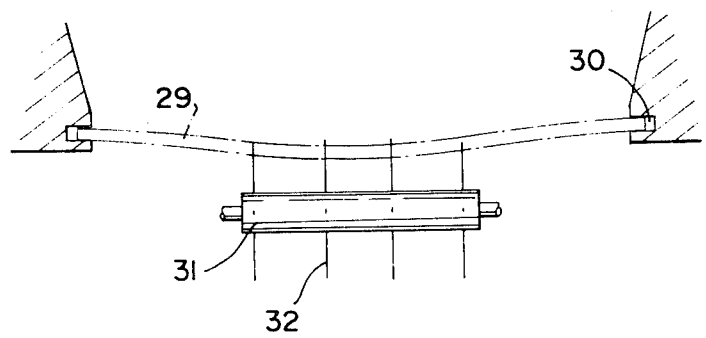
FIG. 8 is a front view schematically showing the anti-warp mechanism of FIG. 7.

In FIGS. 7 and 8 showing the anti-warp mechanism, a print circuit board 29 is conveyed to the main body 1 of the cutter provided with a rotatable blade 11 by the action of a guide member 30 of the conveyor orbit and is brought into contact with the rotatable cutter blade 11 at a predetermined level. The print circuit board 29 has several extending lead wires 29' beyond the lower side thereof. An anti-warp attachment 31 is a rotating member having several contact pins 32 corresponding to the predetermined level at which the print circuit board 29 is conveyed. FIG. 8 shows the front view of an anti-warp attachment of this type and a print circuit board in warped state.

The function of the anti-warp mechanism is to straighten out warp or the like deformation of print circuit boards due to the heat of soldering before the boards are subjected to the cutting operation. It is well known that in view of the economical point of view, a process for soldering print circuit boards is carried out automatically at a high efficiency without necessity of any manual working. In this case, the influence of heat on the boards in the preliminary heating treatment prior to soldering and in the subsequent soldering step using molten solder is indeed significant and a high temperature in these treatments often incurs undesirable warping of the boards. Supply of such warped print circuit boards to the cutter incurs various disadvantages; lead wires extending beyond the boards cannot be cut at a uniform length and the cutter blade may injure the print circuit boards per se or electric parts thereof. These disadvantages result obviously in diminishing the value of the products.

The anti-warp mechanism is devised to overcome such disadvantages. Warped print circuit boards are compulsorily straightened out by the anti-warp attachment comprising the rotating member 31 and the contact pins 32, which is freely rotatable and is actually rotated by the friction force of the conveyed print circuit boards 29 acting on the contact pins 32. Alternatively, the anti-warp attachment may be constructed in such manner that it can be self-rotated at a speed equal to that of the conveyed boards.

Figure 9:
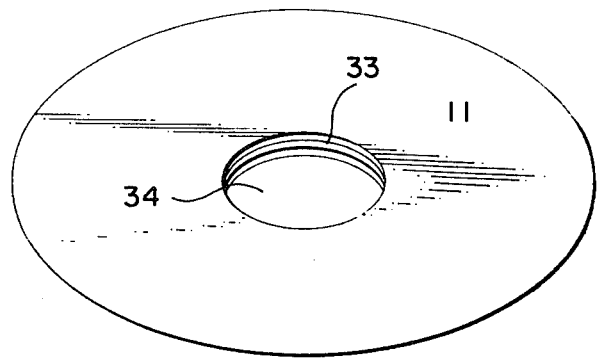
FIG. 9 is a perspective view showing a rotatable cutting blade.

In FIG. 9, a rotatable metal cutter blade 11 has a central fixing hole 34 forming a spot facing 33. The cutter blade is normally in the form of a disk and made of a super hard alloy composed, for example, of 85% chromium or zirconium boride and 15% nickel or of 64% boron carbide and 36% Fe. A super hard alloy of a different composition, for example, the one composed of 70-95% TiC and 5-30% Ni (or Co) or of 66.3% TiC, 15% NbC (or TaC or TiC) and 18.7% Co as well as an equivalent hard alloy can of course be used instead.

Figure 10:
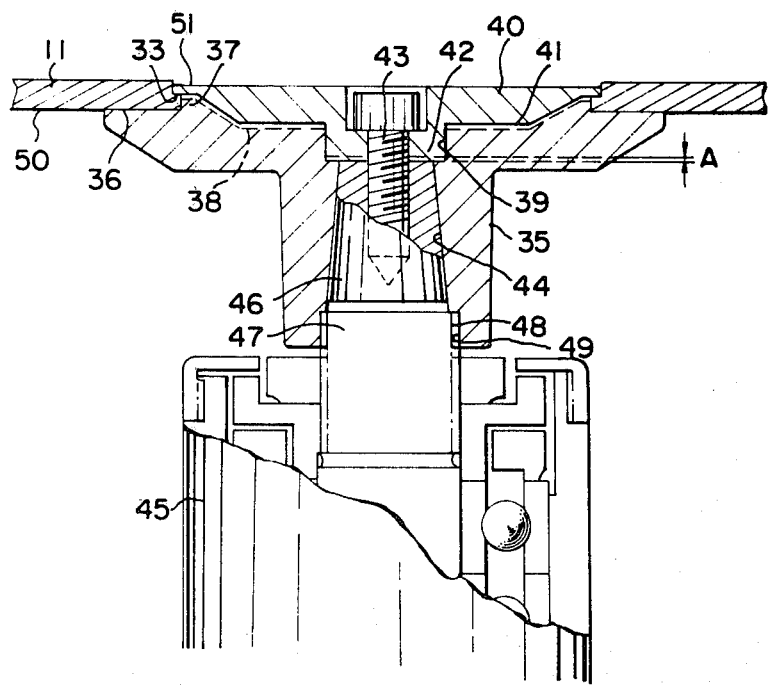
FIG. 10 is a longitudinal cross sectional view showing the cutter mechanism of the lead wire cutter.

In FIG. 10 showing the cutting mechanism, a rotatable metal blade 11 has a central fixing hole 34 forming a spot facing 33, and a flange portion 35 has an annular surface 36 which receives a part of the lower surface 50 of the metal blade 11, a vertically protuberant circular portion 37 which is fitted to the central fixing hole 34, a concave area 38 and a guide hole 39 in the center. A fastening lid member 40 having a pressing periphery 51, a central lower surface 41 and a base poriton 42 is engaged with the flange portion 35 through the guide hole 39. A fixing screwbolt 43 is screw-engaged through the fastening lid member 40 with a rotating shaft 47 of the main body of the cutter 45. A tapered surface 44 of the flange portion 35 is fitted to the tapered end 46 of the rotating shaft 47 of the main body of the cutter 46 whereby a screwed portion 48 on the rotating shaft 47 is engaged with a screwed portion 49 on the flange portion 35. The direction of the screw in the screwed portion 48 on the rotating shaft 47 of the main body of the cutter 45 rotated by a motor and the direction of screw in the screwed portion 49 on the flange portion 35 engaging around the former screwed portion are chosen so as to tighten both screwed portions by rotation whereby the tapered surface 44 and the tapered end 46 of the rotating shaft 47 are tightly connected by rotation at a high speed. The flange portion 35 is provided at the central portion with a concave area 38 and a guide hole 39 so as to receive the fastening lid member 40 comprising the base portion 42 and the pressing periphery 51 capable of touching the spot facing 33 to fix the metal blade 22 directly. The guide hole 39, in particular, facilitates determination of the position of the fastening lid member 40 by engagement with the base portion 42. The fastening lid member 40 fitted into the central concave area 38 of the flange portion 35 may deform elestically between the central lower surface 41 and the contact surface of the pressing periphery portion 51, thus producing a spring action which is ultimately suppressed by the central concave area 38 receiving the central lower surface 41. The elastic deformation between the central lower surface 41 and the contact surface of the pressing periphery portion 51 of the fastening lid member 40, that is, the force of the pressing periphery portion 51 pressing the spot facing 33 of the metal blade 11 is within a predetermined definite range by the degree of indentation of the central lower portion 41. In other words, the force is determined by the clearance A between the bottom of the guide hole 39 and the lower surface of the base portion 42, as shown in FIG. 10.

In the cutter mechanism, the metal blade 11 is fixed to the main body, i.e. the rotating shaft, of the cutter by the fastening lid member 40 constructed to permit elastic deformation within a given range. This construction brings about such advantages that a safe and precise cutting operation is realized by removing causes of breakage and cracking without reducing strength and durability of the rotatable metal blade 11 and that the fixing construction suitably adapted for high speed rotation wherein the metal blade and the flange portion as fixing substrate are screw-engaged with the shaft of the main body of the cutter through tapered surfaces and screws, improves the effect of fixing the metal blade by the fastening lid member.

Figure 11:
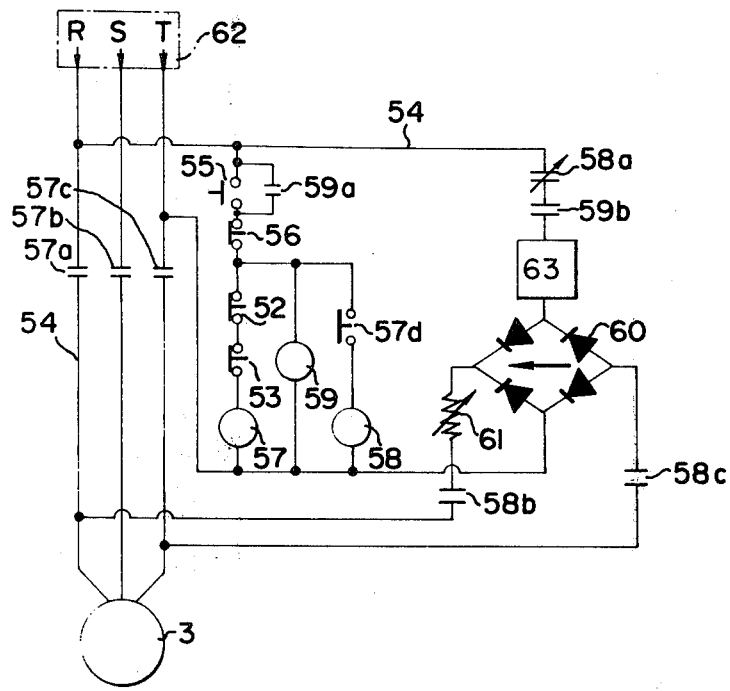
FIG. 11 is a diagram showing an electric circuit for the cutter mechanism of the lead wire cutter.

In FIG. 11, when a start switch 55 is switched on, a self-maintaining relay 59 is operated to make a contact 59a closed to be self-remained and simultaneously a electromagnetic relay 57 is actuated to make contacts 57a to 57c closed, a contact 57d being opened, to thereby drive the motor 3 to allow the rotatable cutter blade to rotate at a high speed. A printed circuit board with lead wires extending beyond the board is conveyed along the guide assembly and brought into contact with the cutter blade whereby the lead wires are cut off.

The main body 1 has an observation window 14 of open-and-close type. When the observation window is kept closed, a limit switch 52 is also kept closed to allow the electromagnetic relay 57 to be actuated by the start switch 55. Upon opening the observation window 14 for certain reasons, the limit switch 52 is also opened with the result that the electromagnetic relay 57 stops to operate and thus three-phase alternating current to motor circuit 54 is disconnected. In this case, a timing relay 58 is energized by closing the contact 57d whereby electric power transformed into direct current by a rectifier 60 which is adjusted by a variable resistor 61 to the corresponding direct current to the motor 3, is fed from three phase alternating current electric power source 62 through a voltage regulator 63 to the motor 3 during only the time of operation delay of a timing relay 58 in the rectifying circuit 54.

It is already known that if an alternative current motor is energized by direct current instead of phase currents, there may be obtained a retarding torque corresponding approximately to full output torque of the electric motor. The present invention is such that in case of opening the observation window in operation accompanied with danger of or by operating the emergency stop switch 53 in case of unexpected circumstances, the actuation of electromagnetic relay 57 is released to remove the three-phase alternating current R,T,S from the motor 3, at the same time to apply to the motor 3 and direct current as brake current such as to be regulated by the rectifying circuit 54 to the rated direct current of the motor 3, to thereby obtain retarding torque by generation owing to the inertia of the rotor of the motor 3, and thus, the inertial rotation of the rotor may be rapidly absorbed whereby a soft and rapid stop is made possible.

When the electric circuit of alternative current for the motor for driving the rotatable blade as a high speed is cut off artificially, or by an unexpected accident such as interruption of service, the direct current charged in the rectifying-charging circuit is simultaneously applied as a brake current to the motor to make sure the rotation is stopped by only the electrical retarding force, not by a mechanical retarding force. Brake current uses the direct current charged during the normal running of the motor so that even in case of service interruption, the retarding of the motor may be surely performed.

Figure 12:
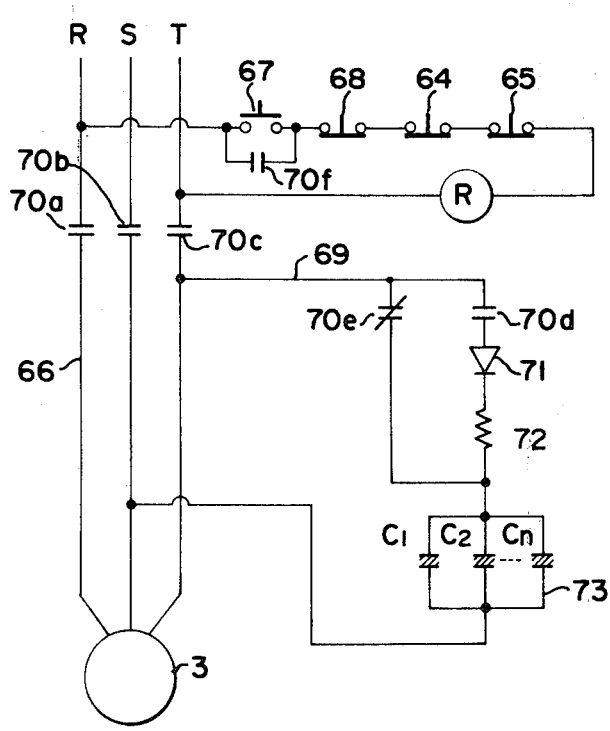
FIG. 12 is a diagram showing another electric circuit for the cutter mechanism of the lead wire cutter.

Referring to FIG. 12, an electromagnetic relay R is actuated by a start switch 67 to close electromagnetic contactors 70a, 70b and 70c to make a motor circuit 66 closed to drive a motor 3, the rotation of which allows the rotatable cutter blade 11 to rotate at a high speed whereby lead wires extending beyond a printed circuit board conveyed along a guide assembly are cut off.

A charging-rectifying circuit 69 is, when cutting off the lead wires of a printed circuit board by rotation of the motor, arranged so as to close an electromagnetic contactor 70d to rectify the electric power from the S and T phase of the three-phase alternating current electric power source throught a half-wave rectifier 71 and a protecting resistor 72, the direct current thus obtained being charged in a capacitance means 73 which is constituted of a group of condensers ($C_1 \ldots C_n$) connected in parallel each other.

Now, when a limit switch 64 is released by opening an observation window 14 of the main body 1 or the emergency stop switch 65 is turned off, then a motor circuit 66 is disconnected, so that the rotation of the motor 3 is stopped. Upon disconnection of the motor circuit 66, electromagnetic contactors 70a to 70d are opened, while an electromagnetic contactor 70e is closed. Accordingly, direct current electric power charged in the capacitance means 73 is applied to the motor 3, and thus, as referred to in FIG. 11, retarding torque corresponding to the full output torque of the motor is obtained. That is to say, application of the direct current from the capacitance means 73 to the motor 3 causes the motor to be stopped rapidly as brake current. In other words, the application causes to stop the inertial rotation of the motor 3, and accordingly, the inertial rotation of the rotatable blade 11.

Needless to say, the operation of the charging-rectifying circuit 69 is effective even in case of service interruption, as stated above. The advantageous points in the maintenance to eliminate danger may be also stated as in the case of FIG. 11.

What is claimed is:

1. A lead wire cutter comprising: a main body having mounted thereto an automatic conveyor mechanism for print circuit boards which conveys said print circuit boards one by one from one end to the other end, a cutter mechanism mounted in the path of conveying of said print circuit boards and provided on the top thereof with an openable observation window, said automatic conveyor mechanism for print circuit boards having a guide rail portion along which said print circuit boards are slidable, a pushing device capable of pushing said print circuit boards on said guide rail portion from one end to the other end and a piston capable of being reciprocally moved within a cylinder so as to operate said pushing device intermittently, said cutter mechanism comprising a metal blade having a central fixing hole forming a spot facing, a flange portion having an upper surface provided with a cut-out step portion comprising an annular surface receiving said metal blade and a vertically protuberant circular portion capable of being fitted with said central fixing hole of the blade, with a rotating shaft of the main body of a cutter and fitted in a tapered portion within a tapered shaft end of said rotating shaft and a fastening lid member having a pressing periphery portion in contact flexibly with said spot facing of said metal blade and a base engaged with a guide hole of said flange portion so as to fit the lower surface of said base to said central concave area and being fixed by a central fixing screwbolt to said rotating shaft of the main body of said cutter, and said cutter mechanism being further provided with a handle enabling adjustment of the position in up-and-down directions.

2. A lead wire cutter according to claim 1 wherein said cutter mechanism includes a three-phase alternating current motor capable of driving said rotating shaft to rotate said metal blade at a high speed, a rectifying circuit capable of rectifying a single phase current of a three phase alternating current power source for said motor, a switch capable of being operated by opening and closing of said openable observation window, an emergency stop switch, a relay provided with a contact capable of being operated by turning-on of either of said switch and said emergency stop switch to cut off said three-phase current power source for said motor and a timer circuit capable of being operated for a given period of time by turning-on of either of the two switches to apply the out-put from said rectifying circuit to said alternating current motor for braking said motor during the given period of time.

3. A lead wire cutter according to claim 2 wherein said cutter mechanism further includes a three-phase alternating current motor capable of driving said rotating shaft to rotate said metal blade at a high speed, a rectifying and accumulating circuit capable of rectifying a single-phase current of a three-phase alternating current power source for said motor, and accumulating the electricity in a condenser, a switch capable of being operated by opening and closing of said openable observation window, an emergency stop switch, and a relay provided with a contact capable of being operating by turning-on of either of said switch and said emergency stop switch to cut off said three-phase alternating current power source for said motor and a contact capable of discharging the electricity accumulated in said rectifying and accumulating circuit to said alternating current motor to brake said motor when said three-phase alternating current power source is cut off.

* * * * *

UNITED STATES PATENT AND TRADEMARK OFFICE
CERTIFICATE OF CORRECTION

PATENT NO. : 4,170,156

DATED : October 9, 1979

INVENTOR(S) : KENSHI KONDO

It is certified that error appears in the above—identified patent and that said Letters Patent are hereby corrected as shown below:

Col. 6, lines 19-20, "elestically" should be --elastically--;

Col. 8, line 56, "out-put" should be --output--.

Signed and Sealed this

Eleventh Day of March 1980

[SEAL]

Attest:

SIDNEY A. DIAMOND

Attesting Officer     Commissioner of Patents and Trademarks